United States Patent
Lee et al.

(10) Patent No.: US 7,301,751 B2
(45) Date of Patent: Nov. 27, 2007

(54) EMBEDDED CAPACITOR

(75) Inventors: Jea-Hyuck Lee, Anyang-si (KR);
Young-Min Lee, Yongin-si (KR);
Shi-Yun Cho, Seoul (KR); Shin-Hee Cho, Suwon-si (KR); Kyung-Wan Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 21 days.

(21) Appl. No.: 11/229,756

(22) Filed: Sep. 19, 2005

(65) Prior Publication Data

US 2006/0098386 A1    May 11, 2006

(30) Foreign Application Priority Data

Nov. 11, 2004    (KR) .................. 10-2004-0091761

(51) Int. Cl.
*H01G 4/06*    (2006.01)
*H01G 4/005*    (2006.01)
*H01G 4/228*    (2006.01)

(52) U.S. Cl. .................. 361/311; 361/303; 361/306.1
(58) Field of Classification Search ............ 361/311, 361/309, 306.1, 306.2, 306.3, 308.1, 308.2, 361/308.3, 307, 303–305, 301.4, 762–763
See application file for complete search history.

(56) References Cited

U.S. PATENT DOCUMENTS

| | | | | |
|---|---|---|---|---|
| 5,027,253 A | * | 6/1991 | Lauffer et al. | 361/321.4 |
| 6,072,690 A | * | 6/2000 | Farooq et al. | 361/321.2 |
| 6,606,237 B1 | * | 8/2003 | Naito et al. | 361/306.3 |

* cited by examiner

*Primary Examiner*—Eric Thomas
(74) *Attorney, Agent, or Firm*—Cha & Reiter, LLC

(57) ABSTRACT

An embedded capacitor comprises a first substrate on which a plurality of electrically insulated electrode patterns and a ground pattern are formed, a second substrate separated from the first substrate, a plurality of dielectric layers stacked between the first and second substrates, a plurality of metal layers inserted between the dielectric layers and connected to the electrode patterns of the first substrate, and a plurality of ground layers inserted between the dielectric layers alternately with the metal layers.

4 Claims, 3 Drawing Sheets

EMBEDDED CAPACITOR

CLAIM OF PRIORITY

This application claims priority to an application entitled "Embedded Capacitor And Method for Manufacturing The Same," filed in the Korean Intellectual Property Office on Nov. 11, 2004 and assigned Serial No. 2004-91761, the contents of which are hereby incorporated by reference.

BACKGROUND OF THE INVENTION

1. Field of the Invention

The present invention relates to a capacitor, and particularly to an embedded capacitor mounted onto a printed circuit board.

2. Description of the Related Art

Electronic components, such as ICs, resistances, capacitors, and inductors, etc., are typically integrated on a printed circuit board. In contrast, an embedded printed circuit having embedded components mounted thereon do not mount any electronic parts through soldering. Instead, the space between embedded components that are stacked on the embedded printed circuit board is filled with conductive material. Thus, the embedded printed circuit board has an advantage in that more parts can be mounted in a small volume compared with a general printed circuit board.

The embedded printed circuit boards are applied to potable electronic products. The embedded printed circuit board may include embedded components, such as resistances, capacitors, inductors, etc. The capacitor accomplishes various functions such as suppression, turning, decoupling, bypassing, and frequency determination, etc.

As the embedded components and the embedded printed circuit boards are becoming popular, the capacitance required for the embedded capacitor is also increased. The embedded capacitor comprises copper films opposing each other and a dielectric layer positioned between the copper films. The capacitance of the embedded capacitor is determined according to the dielectric constant of the dielectric layer, and the area of the copper films, etc.

A dielectric medium of a high dielectric constant must be used or the area of the copper film must be increased, in order to increase the dielectric constant of the embedded constant. When the copper film is actually increased, the dielectric constant of the embedded capacitor is increased but the size of the embedded capacitor is also increased. This is not suitable for the electronic circuit which uses the embedded printed circuit board. Alternatively, the dielectric medium of a high dielectric constant can be used to increase the dielectric constant.

However, the printed circuit board has a structure in which electrode patterns made of a metal are formed on an organic material, which tend to damage at temperature of 250 degrees Celsius during the manufacturing process. Namely, the embedded capacitor which comprises a dielectric medium of a high dielectric constant undergoes a process that require a pressing between the copper films at a high temperature, but the embedded capacitor can not endure the high temperature process.

SUMMARY OF THE INVENTION

Accordingly, the present invention has been made to solve the above-mentioned problems occurring in the prior art and provides additional advantages, by providing an embedded capacitor of a high capacitance.

One aspect of the present invention is to provide an embedded capacitor which can selectively use a capacitance.

In one embodiment, there is provided an embedded capacitor comprising: a first substrate on which a plurality of electrically insulated electrode patterns and a ground pattern are formed; a second substrate separated from the first substrate; a plurality of dielectric layers stacked between the first and second substrates; a plurality of metal layers inserted between the dielectric layers and connected to the electrode patterns of the first substrate; and a plurality of ground layers inserted between the dielectric layers alternately with the metal layers and connected to the ground pattern.

BRIEF DESCRIPTION OF THE DRAWINGS

The above features and advantages of the present invention will be more apparent from the following detailed description taken in conjunction with the accompanying drawings, in which.

DETAILED DESCRIPTION

Hereinafter, embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
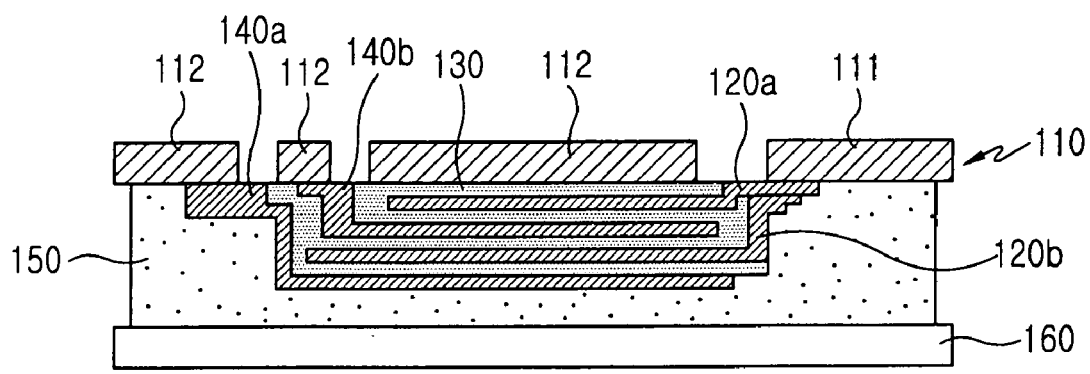
FIG. 1 illustrates an embedded capacitor according to an embodiment of the present invention.

FIG. 1 shows an embedded capacitor according to an embodiment of the present invention. As shown, the embedded capacitor according to the embodiment of the present invention includes a first substrate 110 on which a plurality of electrically insulated electrode patterns 112 and a ground pattern 111 are formed, a second substrate 160 separated from the first substrate 110, a plurality of dielectric layers 130 stacked between the first and second substrates 110 and 160, a plurality of metal layers 140a and 140b inserted between the dielectric layers 130 and connected to the corresponding electrode patterns 112 of the first substrate 110, and a plurality of ground layers 120a and 120b inserted between the dielectric layers 130 alternately with the metal layers 140a and 140b and coupled to the ground pattern 111.

Copper foils can be used as the first and second substrates 110 and 160. A plurality of the electrode patterns 112 electrically insulated from each other are formed by etching, etc. The ground pattern 111 are formed on the first substrate 110.

FIGS. 2a to 2e are views illustrating the manufacturing processes of the embedded capacitor 110 shown in FIG. 1. Referring to FIGS. 2a to 2e, the embedded capacitor 110 is finished by stacking the dielectric layers 130 and the conductive metal and ground layers 120 and 140 in sequence, as explained hereinafter.

Figure 2A:
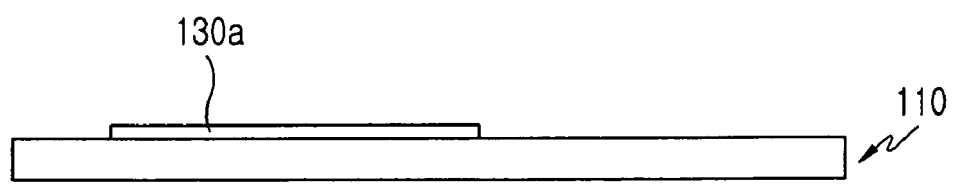
FIGS. 2a to 2e are views showing the manufacturing processes of the embedded capacitor shown in FIG. 1.

FIG. 2a shows a process in which the dielectric layer 130 is stacked on the first substrate 110. The thickness of the dielectric layer 130a stacked on the substrate 110 is preferably within 10 to 15 μm. More specifically, FIG. 2a shows the step in which the dielectric layer 130a is formed by a print screen process.

Figure 2B:
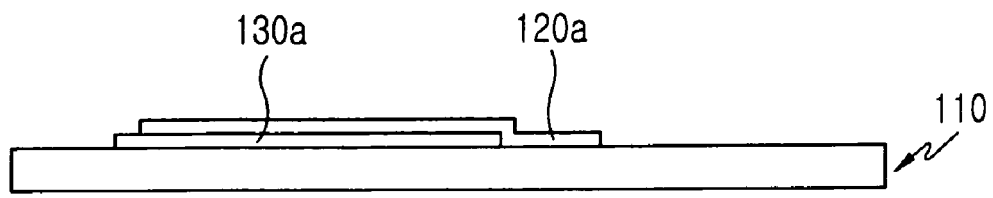

FIG. 2b is a view for showing a process in which the conductive ground layer 120a is stacked on the dielectric layer 130a that is stacked on the first substrate 110. The ground layer 120a is also formed by a print screen process, etc. The ground layer 120a may be made from a conductive metal.

Figure 2C:
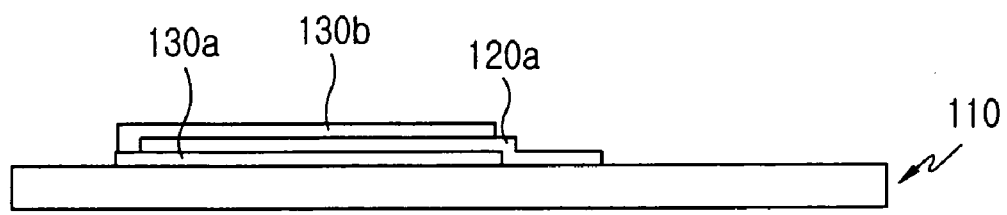

FIG. 2c is a view for showing a process in which the dielectric layer 130b is stacked on the ground layer 120a. The dielectric layers 130a and 130b are grown with the ground layer 120a between them.

Figure 2D:
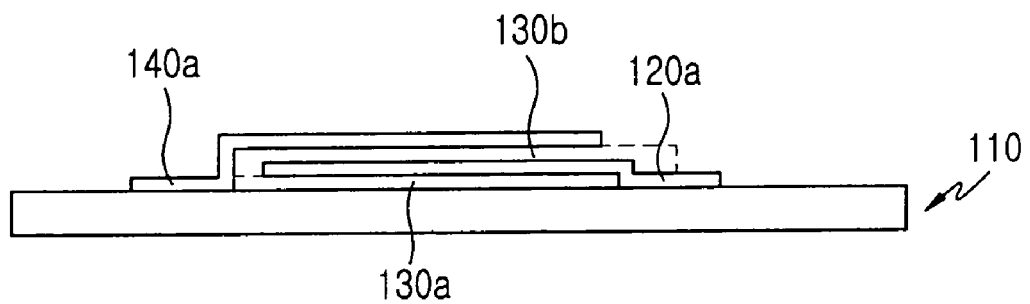

FIG. 2d is a view for showing a process in which the metal layers 140a opposite to the ground layers 120a are formed with the corresponding dielectric layers 130a and 130b between them.

Figure 2E:
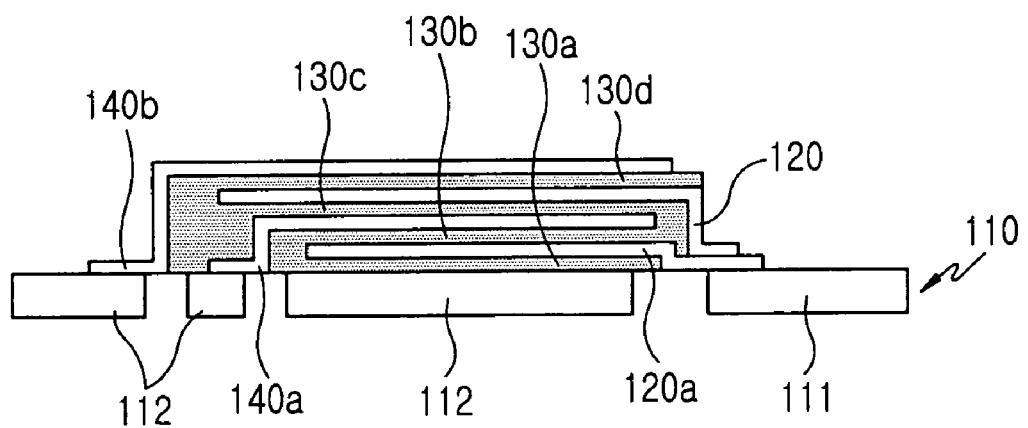

Referring to FIG. 2e, the dielectric layers 130a, 130b, 130c, and 130d, the metal layers 140a and 140b, and the ground layers 120a and 120b are formed by print screen processes. The metal layers 140a and 140b and the ground layers 120a and 120b are made of a conductive material such as a metal. Each of the ground layers 120a and 120b is positioned so as to be opposite to the metal layer 140a and 140b, with the dielectric layers 130a, 130b, 130c, and 130d between them.

The ground layers 120a and 120b are electrically connected to the ground pattern 111. Each of the electrode patterns 112 formed on the first substrate 110 is connected to the corresponding metal layer 140a and 140b. Namely, the metal layers 114a and 114b are electrically insulated from each other, but the ground layers 120a and 120b are electrically connected to the ground pattern 111.

One surface of the first substrate 110 on which the dielectric layers 130a, 130b, 130c, and 130d, the metal layers 140a and 140b, and the ground layers 120a and 120b are stacked is engaged with a resin 150 having permeated between the first and second substrates 110 and 160. The first and second substrates 110 and 160 are pressed at a temperature of over 800 degrees Celsius, and the embedded capacitor 110 is finished by a prepreg process where the bonding is performed by injecting an adhesive agent etc.

The embedded capacitor 100 accumulates a capacitance of a predetermined amount by applying a negative current to the ground pattern 111 and by applying a positive current to the electrode pattern 112. Thus, the embedded capacitor 100 can regulate the capacitance by selectively connecting the electrode pattern.

The embedded capacitor 100 according to the present invention can be stacked on an embedded printed circuit board together with electronic components of different embedded type, and the components can be electrically connected by the coated conductive materials as occasion demands. Accordingly, the present invention can increase the capacitance of the imbedded capacitor without any dielectric bodies with a high dielectric constant.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An embedded capacitor comprising:
   a first substrate on which a plurality of electrically insulated electrode patterns and a ground pattern are formed;
   a second substrate;
   a plurality of dielectric layers stacked between the first and second substrates;
   a plurality of metal layers inserted between the plurality of-dielectric layers and coupled to the electrode patterns of the first substrate; and
   a plurality of ground layers inserted between the dielectric layers and the metal layers in sequence, wherein each of the first and second substrates comprises a copper foil.

2. The embedded capacitor according to claim 1, wherein each of the electrode patterns formed on the first substrate is electrically coupled to the corresponding metal layer.

3. The embedded capacitor according to claim 1, wherein the ground pattern formed on the first substrate is electrically coupled to the ground layers.

4. The embedded capacitor according to claim 1, wherein the thickness of the plurality of dielectric layers ranges between 10 to 15 μm.

* * * * *